(12) United States Patent
Hasler et al.

(10) Patent No.: US 7,714,650 B2
(45) Date of Patent: May 11, 2010

(54) METHOD AND DEVICE FOR PERFORMING OFFSET CANCELLATION IN AN AMPLIFIER USING FLOATING-GATE TRANSISTORS

(75) Inventors: Paul Hasler, Atlanta, GA (US); Venkatesh Srinivasan, Atlanta, GA (US); Guillermo Serrano, Atlanta, GA (US); Jordan Gray, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 350 days.

(21) Appl. No.: 11/468,444

(22) Filed: Aug. 30, 2006

(65) Prior Publication Data

US 2007/0210860 A1   Sep. 13, 2007

Related U.S. Application Data

(60) Provisional application No. 60/712,623, filed on Aug. 30, 2005.

(51) Int. Cl.
*H03F 3/45* (2006.01)
(52) U.S. Cl. .................................... 330/253
(58) Field of Classification Search ......... 330/252–261; 327/562, 563
See application file for complete search history.

(56) References Cited

U.S. PATENT DOCUMENTS

| 5,557,234 | A  | * | 9/1996  | Collins ................. 327/563 |
| 5,942,936 | A  | * | 8/1999  | Ricco et al. ........... 327/563 |
| 6,166,978 | A  |   | 12/2000 | Goto |
| 6,683,645 | B1 |   | 1/2004  | Collins et al. |
| 7,038,544 | B2 |   | 5/2006  | Diorio et al. |
| 2005/0140448 | A1 | * | 6/2005 | Diorio et al. ........... 330/277 |

OTHER PUBLICATIONS

International Search Report for International Patent Application No. PCT/US2006/034197 dated Feb. 21, 2007.

* cited by examiner

*Primary Examiner*—Robert Pascal
*Assistant Examiner*—Khiem D Nguyen
(74) *Attorney, Agent, or Firm*—Troutman Sanders LLP; Ryan A. Schneider, Esq.; Trenton A. Ward, Esq.

(57) ABSTRACT

An operational amplifier including: a differential pair of transistors coupled to a pair of input signals; and a pair of floating-gate transistors coupled to the differential pair of transistors, wherein the pair of floating-gate transistors are operable for reducing an offset voltage of the operational amplifier.

9 Claims, 7 Drawing Sheets

US 7,714,650 B2

METHOD AND DEVICE FOR PERFORMING OFFSET CANCELLATION IN AN AMPLIFIER USING FLOATING-GATE TRANSISTORS

CROSS REFERENCE TO RELATED APPLICATIONS

This application claims priority of U.S. Provisional Patent Application No. 60/712,623 filed Aug. 30, 2005, the entire contents and substance of which are hereby incorporated by reference.

BACKGROUND

1. Field of the Invention

The present invention relates generally to offset cancellation in amplifiers, and more specifically to method and device for performing offset cancellation in an amplifier using floating-gate transistors.

2. Description of Related Art

An operational amplifier, usually referred to as an 'op-amp', is a DC-coupled high-gain electronic voltage amplifier with differential inputs and, usually, a single output. In its ordinary usage, the output of the op-amp is controlled by negative feedback which, because of the amplifier's high gain, almost completely determines the output voltage for any given input. Op-amps are among the most widely used electronic devices today, being utilized in a vast array of consumer, industrial and scientific devices. General-purpose integrated op-amps of standard specification sell for well under one U.S. dollar. Modern designs are electronically more rugged than earlier implementations and some can sustain direct short-circuits on their outputs without damage.

A practical concern for op-amp performance is voltage offset. That is, effect of having the output voltage something other than zero volts when the two input terminals are shorted together. Operational amplifiers are differential amplifiers which are designed to amplify the difference in voltage between the two input connections and nothing more. In an ideal situation, when that input voltage difference is exactly zero volts, zero volts are expected to be present on the output. However, in the real world the ideal case rarely happens, even if the op-amp in question has zero common-mode gain, the output voltage may not be at zero when both inputs are shorted together.

Mismatches between MOS transistors pose a serious challenge to analog circuit designers and most commonly manifest themselves as an offset voltage in operational amplifiers. Techniques commonly used to reduce the offset voltage include auto-zeroing, correlated double sampling and chopper stabilization. Auto-zeroing and correlated double sampling are techniques applicable to sampled data systems while chopper stabilization allows continuous-time operation of the amplifier. Alternate techniques include resistor trimming through the use of poly-fuses or laser trimming. These typically involve special processing steps and are usually expensive.

BRIEF SUMMARY

Disclosed herein is an operational amplifier including: a differential pair of transistors coupled to a pair of input signals; and a pair of floating-gate transistors coupled to the differential pair of transistors, wherein the pair of floating-gate transistors are operable for reducing an offset voltage of the operational amplifier.

Also disclosed herein is an operational amplifier including: a differential pair of transistors, including a first and a second transistor; a pair of floating-gate transistors, including a third and fourth transistor; wherein the pair of floating-gate transistors are coupled to one another at a drain node, wherein the differential pair of transistors are coupled to a source node of the pair of floating-gate transistors, and wherein the pair of floating-gate transistors are operable for reducing an offset voltage of the operational amplifier.

Further disclosed herein is an operational amplifier including: a differential pair of transistors, including a first and a second transistor; a pair of floating-gate transistors, including a third and fourth transistor; wherein the differential pair of transistors are coupled to one another at a drain node, wherein the pair of floating-gate transistors are coupled to a source node of the differential pair of transistors, and wherein the pair of floating-gate transistors are operable for reducing an offset voltage of the operational amplifier.

These and other objects, features and advantages of the present invention will become more apparent upon reading the following specification in conjunction with the accompanying drawing figures.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Disclosed herein is a floating-gate based offset cancellation scheme that results in a continuous-time operation of the amplifier with long-term offset cancellation that obviates the need for any refresh circuitry. In one embodiment, the amplifier is able to reduce offset voltage to ±25 μV. The use of floating-gate transistors for correcting mismatches in analog circuitry also offers programmability and long-term retention. In one embodiment, the floating-gate transistors may be fabricated in a standard digital CMOS process. The use of floating-gate transistors in the continuous-time operation of the amplifier involves no sampling and hence avoids such issues as charge injection, clock feedthrough and under-sampled wideband noise that are serious limitations to autozeroing and correlated double sampling. Also, unlike chopper stabilization, the disclosed system is not limited to low-bandwidth applications and offers continuous-time operation with comparable offset reduction.

Figure 1:
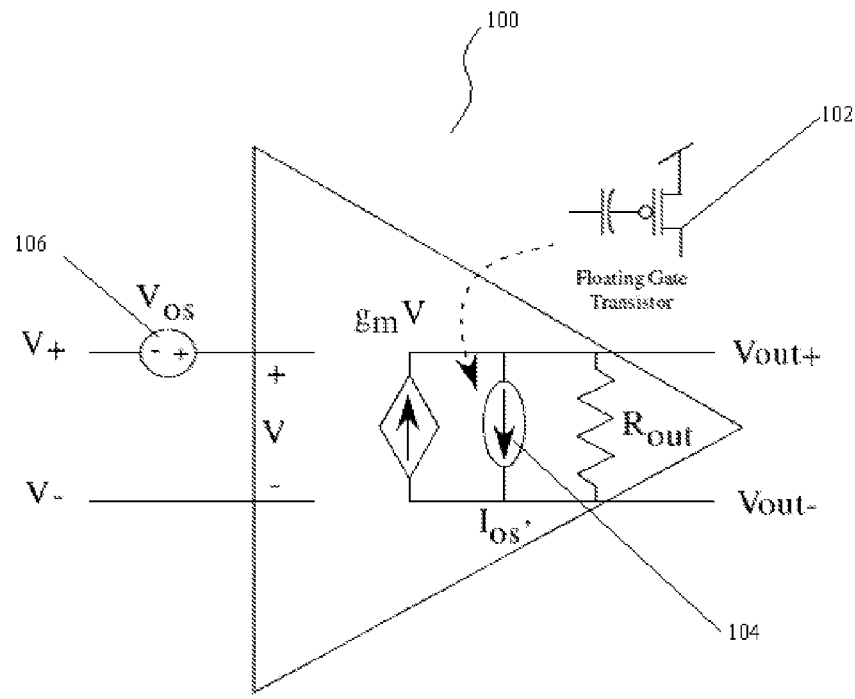
FIG. 1 illustrates a conceptual representation of offset cancellation in an operational amplifier in accordance with exemplary embodiments.

The disclosed system involves using floating-gate transistors as both an integral part of the circuit of interest and as programmable elements. FIG. 1 shows a conceptual representation of offset cancellation in an operational amplifier referred to generally as 100. Floating-gate transistors 102 are used as programmable current sources ($I_{os'}$) 104 that provide offset compensation while being a part of the amplifier 100 during normal operation. The amplifier 100 has a compact architecture with a simple design that avoids the overhead of using floating-gate transistors as separate trimming elements and the offset cancellation by itself dissipates no additional power.

The drain-source current through an n-channel MOS transistor for weak inversion operation, ignoring early effects and assuming saturation, is given by, $$I_{DS} = I'_o \exp\left(\frac{k(V_g - V_{th})}{U_T}\right) \exp\left(\frac{-V_s}{U_T}\right) \exp\left(\frac{(1-k)V_b}{U_T}\right) \quad (1)$$

where, $U_T$ is the thermal voltage that is equal to kT/q, the voltages $V_g$, $V_s$ and $V_b$ represent the voltages applied to the gate, source and bulk terminals and are referenced to ground. $V_{th}$ represents the bulk referred threshold voltage of the device that is given by, $$V_{th} = V_{FB} + \psi_o + \gamma\sqrt{\psi_o} \quad (2)$$

where, $V_{FB}$ is the flat-band voltage, to ψo=2ϕF+several $$U_T, \gamma = \sqrt{\frac{2q \in_s N_{sub}}{C_{ox}}}$$

is the body effect co-efficient and $$\phi F = \frac{kT}{q}\ln\left(\frac{N_{sub}}{n_i}\right)$$

is the Fermi potential of the bulk. The pre-exponential constant $I'_o$ is given by, $$I'_o = \left(\frac{1-k}{k}\right)\mu_\eta C_{ox}\frac{W}{L}U_T^2\exp\left(\frac{\psi_o - 2\phi F}{U_T}\right) \quad (3)$$

where, $C_{ox}$ is the gate oxide per unit area, W is the width of the device, L is the length of the device, $\mu_n$ is the electron mobility and k is as below, $$k = 1 - \frac{\gamma}{2 \cdot \sqrt{V_{gb} - V_{th}(\frac{\gamma}{2} + \sqrt{\psi_o})^2}} = \frac{C_{ox}}{C_{ox} + C_{dep}} \quad (4)$$

where, all variables are as defined earlier and $C_{dep}$ is the depletion capacitance in the bulk per unit area.

In the strong inversion region of operation, the drain-source current, again, assuming saturation and ignoring early effects is given by, $$I_{DS} = \frac{\mu_n C_{ox} W}{2\kappa L}(\kappa(V_{gb} - V_{To}) - V_{sb})^2 \quad (5)$$

where, all variables have the same meaning and definitions as given earlier. Although, the equations have been presented for an nFET, corresponding equations can be arrived at for pFETs after making appropriate sign changes.

Figure 2:
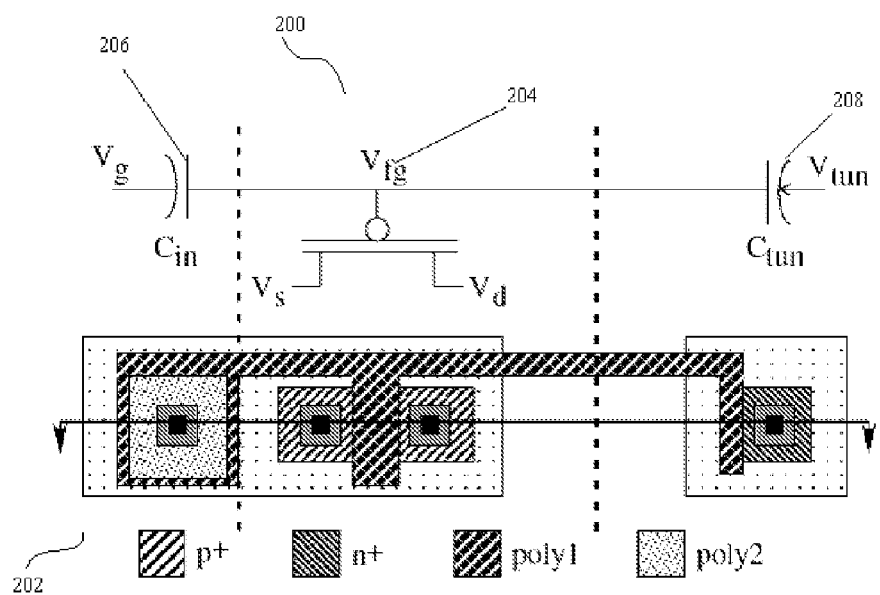
FIG. 2 illustrates a circuit schematic and layout of a single-poly floating-gate pMOS transistor in accordance with exemplary embodiments.

Floating-gate transistors have been used as non-volatile memory elements in SRAMs and EEPROMs. A floating-gate MOS transistor is a transistor whose poly-silicon gate is completely surrounded by $SiO_2$, a high quality insulator. This creates a potential barrier that prevents charge stored on the floating-gate from leaking from the floating node. FIG. 2 illustrates a circuit schematic and layout of a single-poly floating-gate pMOS transistor which are referred to generally as 200 and 202 respectively. In order to maintain the non-volatile charge storage of the floating-gate 204, external inputs are capacitively coupled through an input capacitor $C_{in}$ 206. It should be noted that the second polysilicon layer shown in FIG. 2 is used primarily to implement the input capacitor 206.

Programming a floating-gate transistor 200 involves adding or removing charge from the floating-gate 204 thereby modulating the threshold voltage of the device. Charging the floating gate is achieved through the physical phenomena of hot-electron injection that adds electrons to the floating-gate 204 and Fowler-Nordheim tunneling that removes electrons from the floating-gate 204. Tunneling is used primarily as a global erase and is achieved by capacitive coupling through $C_{tun}$ 208 and precision programming is achieved through hot-electron injection. Such a scheme has a number of advantages over a tunneling based programming, which include faster programming (as the logarithmic dependence of tunneling makes precision programming highly time-consuming), avoiding special processing steps such as ultra-thin tunneling oxide and the use of high voltages of both positive and negative polarities.

Hot-electron injection occurs in pFETs when carriers are accelerated to a high enough energy level to surmount the Si—$SiO_2$ barrier. At high drain currents, electrons are created at the drain edge of the drain-to-channel depletion region via hot-hole impact ionization. These electrons travel back into the channel region, gain sufficient kinetic energy such that they cross the Si—SiO$_2$ barrier and are injected onto the floating-gate 204.

Figure 3:
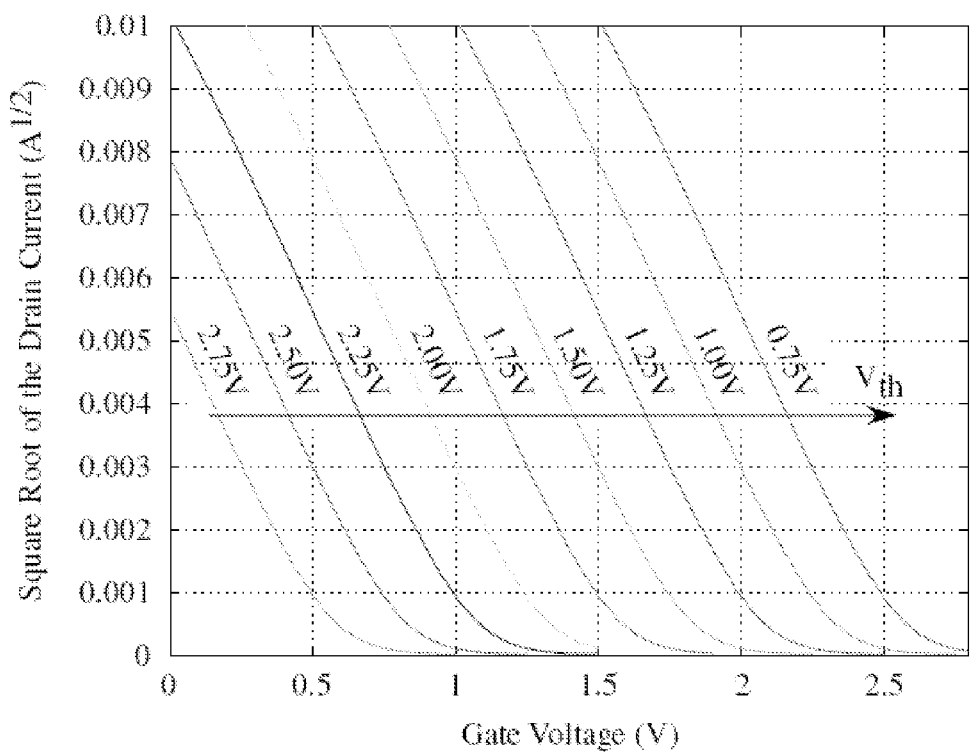
FIG. 3 illustrates a graph that demonstrates the wide range in programming capabilities of the floating-gate device in accordance with exemplary embodiments.

Programming is achieved by first isolating the floating-gate transistor 200 from the rest of the circuitry and applying a source-drain potential (V$_{SD}$) greater than 3V for a short period of time ranging from 20 μs-1 ms. The number of electrons injected and hence the change in the drain current is a function of the source-drain potential V$_{SD}$ and the time interval t$_{pulse}$ for which V$_{SD}$ is held high enough to cause hot-electron injection. The required value of V$_{SD}$ and the pulse interval are estimated from the relationship between the initial drain current and the desired target current. Using the above programming methodology, a floating-gate pFET transistor can be programmed to different threshold voltages with their magnitudes ranging from 0.75V-2.75V as demonstrated in FIG. 3. It should be noted that the absolute value of the threshold voltage of a pFET device that is not a floating-gate in the 0.5 μm process is 0.9V. FIG. 3 clearly demonstrates the wide range in programming capabilities of the floating-gate device.

The accuracy to which a floating-gate transistor can be programmed to a target current depends on the smallest drain current change that can be programmed onto a floating-gate device. In order to estimate the design choices available to improve programming precision, a figure of merit (FOM) is defined as, $$FOM = -\log_2\left(\frac{\Delta I}{I}\right) \quad (6)$$

where, ΔI is the minimum programmable change in drain current that is necessary to meet a system level accuracy specification and I is the bias current of the floating-gate transistor. It should be noted that such a definition results in the FOM being represented in the familiar binary system, as number of bits of accuracy achievable. Below the FOM is related to floating-gate circuit parameters for operation in both the weak inversion and strong inversion regimes such that the floating-gate transistor can be designed to achieve required bits of precision.

Using (1) and (3), the drain current of a pFET operating in the weak inversion regime, ignoring early effects can be simplified as, $$I = I_0 \exp\left(\frac{-kV_g}{U_T}\right) \exp\left(\frac{V_s}{U_T}\right) \quad (7)$$

where, I$_o$ is a pre-exponential constant that includes I'$_o$ and terms including the threshold voltage and the bulk potential.

Now, for a ΔV$_g$ change in the gate voltage, a ΔI change in drain current, the net programmed drain current of the device is given by, $$I + \Delta I = I_o \exp\left(\frac{-k(V_g + \Delta V_g)}{U_T}\right) \exp\left(\frac{V_s}{U_T}\right) \quad (8)$$

Dividing (8) by (7) and noting that ΔV$_g$=ΔQ/C$_T$, the achievable change in drain current due to programming relative to the initial drain current is given by, $$\frac{\Delta I}{I} = \exp\left(\frac{-\kappa \Delta Q}{U_T C_T}\right) - 1 \quad (9)$$

where, C$_T$ is the total capacitance at the floating-gate and ΔQ is the programmed charge.

In most cases, the term inside the exponential is much less than one, and therefore, the Taylor series approximation for the exponential can be used to arrive at the simplified expression shown below, $$\frac{\Delta I}{I} \approx \frac{-k\Delta Q}{U_T C_T} \quad (10)$$

It is clear from (10) that the achievable precision is directly proportional to the charge that can be reliably transferred onto the floating-gate and inversely proportional to the total floating-gate capacitance.

Consider a floating-gate nFET that can be programmed using an indirect programming scheme. The drain current, ignoring early effects is rewritten for convenience as, $$I = \frac{\mu_n C_{ox} W}{2kL}(kV_g - V_s - kV_{th})^2 \quad (11)$$

where, all variables have the usual meaning.

Programming the device such that a charge transfer of ΔQ results in a change in the gate voltage of ΔV$_g$ modifies the drain current to be, $$I + \Delta I = \frac{\mu_n C_{ox} W}{2kL}(k(V_g + \Delta V_g) - V_s - kV_{th})^2 \quad (12)$$

Dividing (12) by (11) and manipulating with the assumption that (ΔV$_g$) is much smaller than the overdrive voltage V$_{od}$=κV$_g$−V$_s$−κV$_{th}$ results in, $$\frac{\Delta I}{I} = \frac{2k\Delta V_g}{kV_g - V_s - kV_{th}} = \frac{2k\Delta Q}{V_{od} C_T} \quad (13)$$

As can be observed from (13), the achievable precision is directly proportional to the charge that can be transferred onto the floating-gate and inversely proportional to the overdrive voltage of the device and the total floating-gate capacitance.

Figure 4:
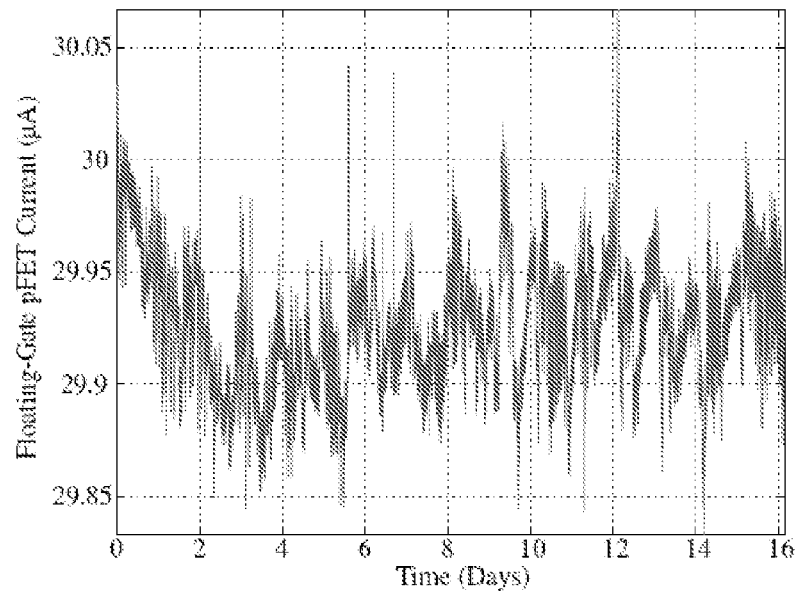
FIG. 4 illustrates a graph of a drain current of a floating-gate pFET measured over a period of 380 hours.

Floating-gate transistors inherently have good charge retention capabilities on account of the gate being surrounded by a high quality insulator. FIG. 4 shows the drain current of a floating-gate pFET measured over a period of 380 hours. The drain current was programmed to an initial value of 30 μA and displayed a mean value of 29.93 μA with a standard deviation of 28 nA. The current exhibits a short-term drift in the beginning beyond which no significant drift can be observed. Although this is a good indicator of the charge retention capabilities of floating-gates, accurate estimates of the long-term charge retention can be made through accelerated life time tests.

Long-term charge loss in floating-gates occur due to the phenomenon know as thermionic emission. The amount of charge lost is a function of both temperature and time and is given by, $$\frac{Q(t)}{Q(0)} = \exp\left[-tv \cdot \exp\left(\frac{-\phi B}{kT}\right)\right] \quad (14)$$

where, Q(0) is the initial charge on the floating-gate, Q(t) is the floating-gate charge at time t, v is the relaxation frequency of electrons in poly-silicon, $\phi B$ is the Si—SiO$_2$ barrier potential, κ is the Boltzmann's constant and T is the temperature. As expected from (14), charge loss in floating-gates is a slow process that is accelerated at high temperatures.

Floating-gate charge loss is measured indirectly by measuring the change in the transistor's threshold voltage. Programming floating-gates by adding/removing charge modifies the threshold voltage of the device, $V_{th}$, as given by, $$V_{th} = V'_{th} + \frac{Q}{C_T} \quad (15)$$

where, Q is the floating-gate charge, $V'_{th}$ is the threshold voltage of the transistor with zero floating-gate charge or that of a non floating-gate device and $C_T$ is the total capacitance at the gate node. Using the above approximation for the threshold voltage of a floating-gate device the charge loss in a floating-gate can be rewritten as, $$\frac{Q(t)}{Q(0)} = \frac{V_{th}(t) - V'_{th}}{V_{th}(0) - V'_{th}} \quad (16)$$

where, $V_{th}(t)$ indicates the threshold voltage of the device after time t and $V_{th}(0)$ represents the initial programmed threshold voltage.

Estimating the amount of charge loss in floating-gates requires the estimation of the parameters v and $\phi B$ as these parameters exhibit a wide spread in their values and therefore need to be extracted for each process. For the 0.5 µm process used in the design, floating-gate pFETs were programmed to a threshold voltage of −0.5V and stored at high temperatures for a predefined time period. The change in threshold voltage is measured and, using (16), the charge loss is estimated. Using (14), (16) and the measured data points, v and $\phi B$ can be extracted using, $$\phi_B = \frac{kT_1T_2}{T_1 - T_2} \ln\left[\frac{t_2}{t_1} \cdot \frac{\ln(x_1)}{\ln(x_2)}\right], \quad v = \frac{-\ln(x_1)}{t_1 \cdot \exp\left(\frac{\phi_B}{kT_1}\right)} \quad (17)$$

where, x denotes the ratio of the floating-gate charge at time t to the initial floating-gate charge and the subscripts denote two different data points. Using the above procedure, the values for the barrier potential and the relaxation frequency were extracted to be 0.9 eV and 60 s−1 for the 0.5 µm CMOS process used in the experiments.

Figure 5:
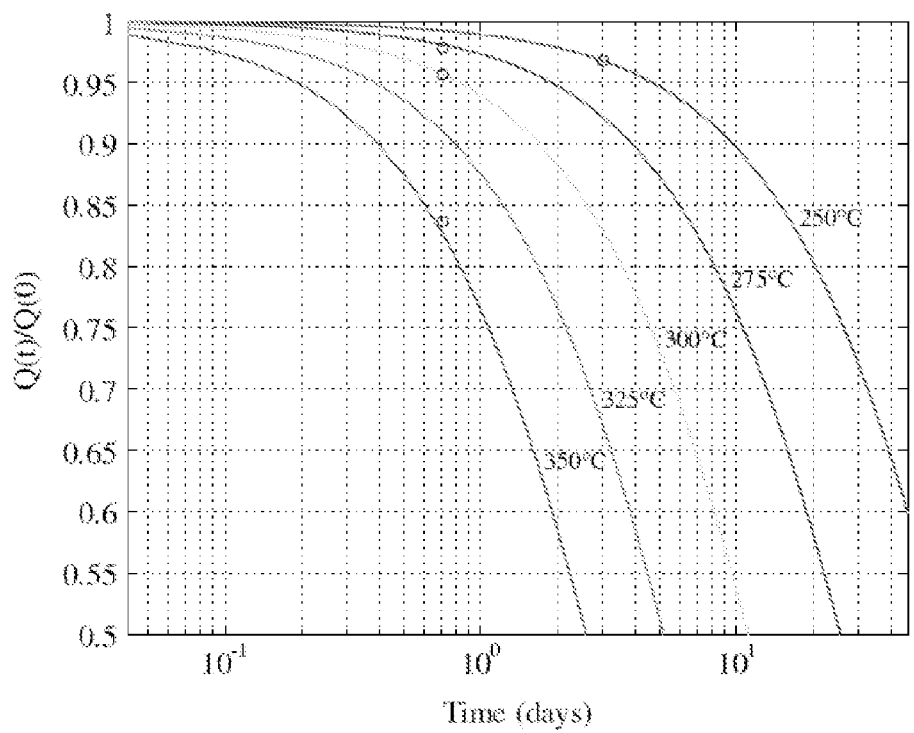
FIG. 5 illustrates a graph that shows the measured floating-gate charge loss along with a theoretical extrapolated fit using the estimated model parameters.

FIG. 5 shows the measured floating-gate charge loss along with a predicted extrapolated fit using the estimated model parameters. The measured data agrees well with the prediction and the trends observed in FIG. 5 have been observed across many floating-gate devices.

In one embodiment, two identical floating-gate transistors can be programmed to a difference in current of ΔI, make up a differential floating-gate pair (DFGP). Assuming weak inversion operation, the difference in charge between the two floating-gates is given by, $$\Delta Q = C_T \frac{U_T}{k} \ln\left(1 + \frac{\Delta I}{I}\right) = C_T \Delta V_{fg} \quad (18)$$

where, all the variables have their usual meaning. Now, using (14) and the extracted values of $\phi B$ and v, the difference in charge at time t, namely, ΔQ(t) can be estimated. From this, the difference in floating-gate voltage can be calculated, based on which and using (18), the value of the programmed difference current at time t (ΔI(t)) can be estimated. The table below summarizes the data retention numbers for two different cases of programmed difference currents, namely, a 10% change and a 50% change for a time period of 10 yrs for different temperatures. A total floating-gate capacitance of 100 fF and a κ of 0.7 has been assumed for these calculations. As can be observed, floating-gate transistors display excellent charge retention capabilities. The non-volatile charge retention when combined with programmability, makes floating-gate transistors well suited for use in precision analog circuits.

| Temper-ature | 10% Programmed Change | | | 50% Programmed Change | | |
|---|---|---|---|---|---|---|
| | ΔQ/Q | ΔV$_{fg}$ | ΔI/I | ΔQ/Q | ΔV$_{fg}$ | ΔI/I |
| 25° C. | 1e-3% | 36.7 nV | 2e-4% | 1e-3% | 156 nV | 9e-4% |
| 90° C. | 0.62% | 16.4 µV | 0.06% | 0.62% | 65 µV | 0.47% |
| 140° C. | 18.2% | 0.45 mV | 1.8% | 18.2% | 1.92 mV | 10.7% |

The use of floating-gate transistors to cancel the input offset voltage of an amplifier is demonstrated by an Op-amp macromodel shown in FIG. 1. The offset voltage of the amplifier 100 V$_{os}$ 106 is nullified by programming an offset current I$_{os}$, 104 in the opposite direction. The offset current I$_{os}$, 104 is made programmable by using floating-gate transistors 102 to set the current.

Figure 6:
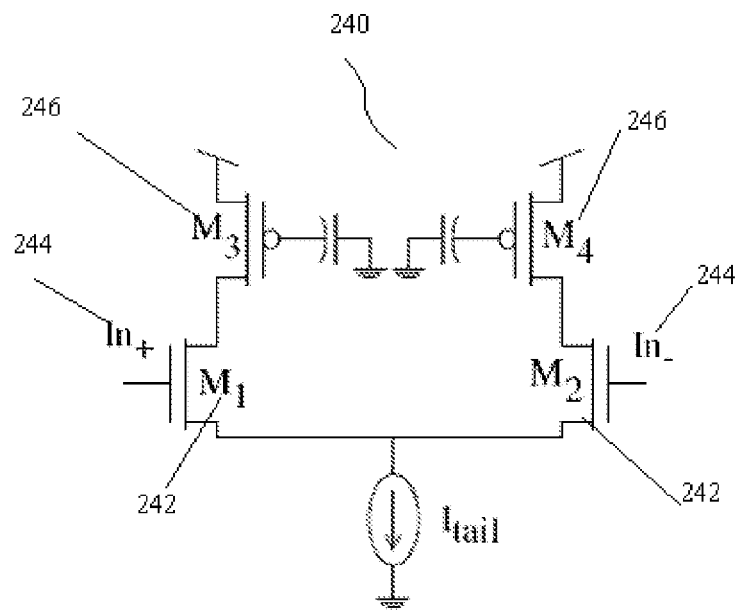
FIG. 6 illustrates an operational amplifier including floating-gate transistors in accordance with exemplary embodiments.

Referring now to FIG. 6, an exemplary embodiment of an operational amplifier including floating-gate transistors is generally depicted as 240. The operational amplifier 240 is a single stage folded cascade amplifier that includes an input differential pair of transistors 242 (M1, M2) that are coupled to input signals 244 I$_n$$^+$ and I$_n$$^-$. The amplifier 240 also includes a floating-gate transistor pair 246 (M3, M4) that are coupled to the drain of the differential pair of transistors 242. The floating-gate transistor pair 246 is operable for reducing the offset voltage of the operational amplifier and for reducing the temperature sensitivity of the operational amplifier. In one embodiment, the floating-gate transistor pair 246 may be coupled to a programming circuitry operable for setting the voltage stored by the floating-gate transistors, refer to FIG. 8 for a more thorough discussion of the programming circuitry.

Figure 7:
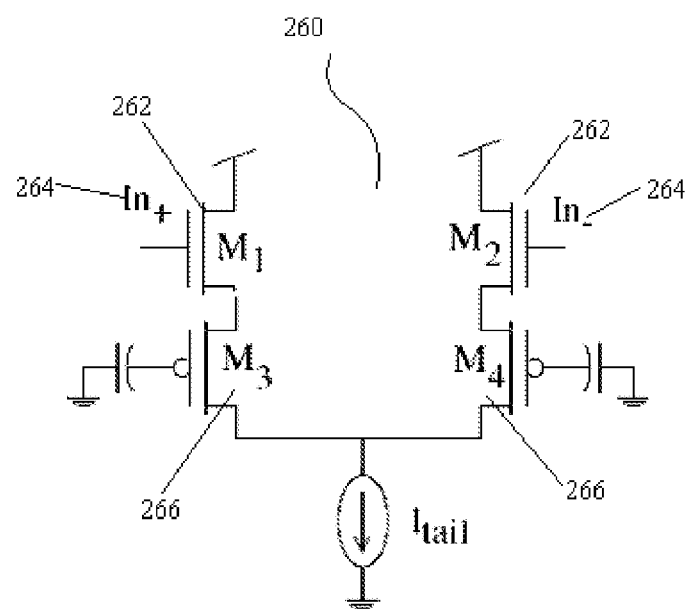
FIG. 7 illustrates an operational amplifier including floating-gate transistors in accordance with exemplary embodiments.
Figure 8:
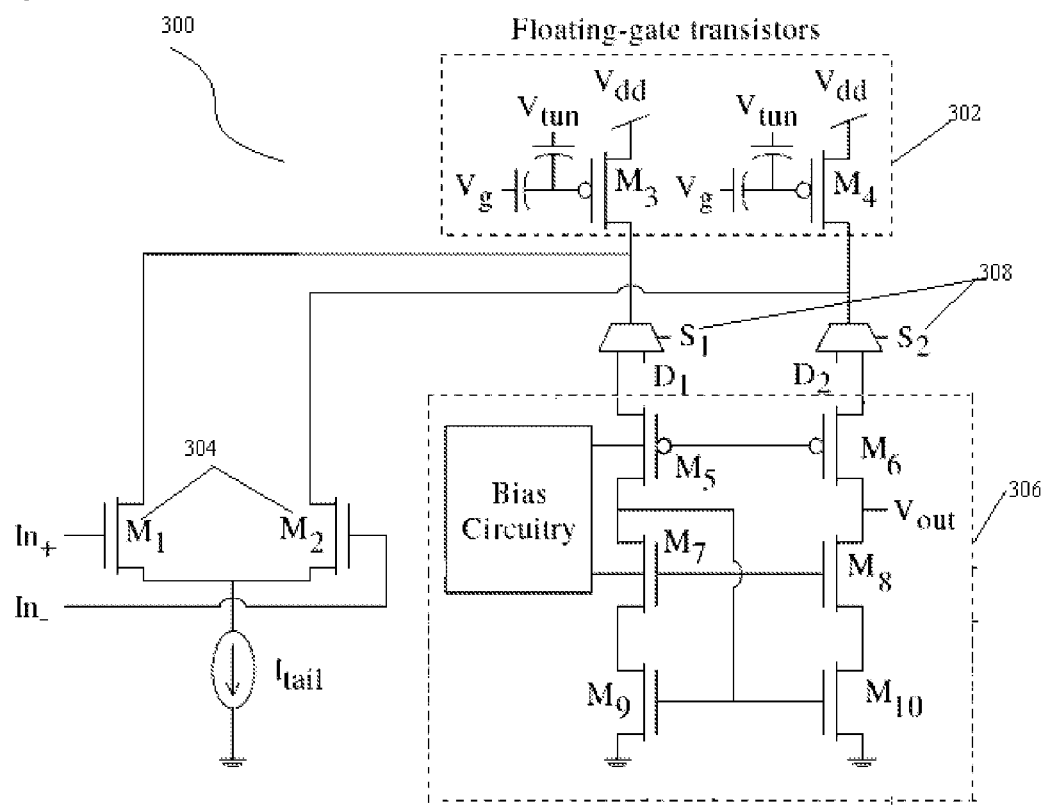
FIG. 8 illustrates a single stage folded cascode amplifier including floating-gate transistors in accordance with exemplary embodiments.

Turning now to FIG. 7, an exemplary embodiment of an operational amplifier including floating-gate transistors is generally depicted as 260. The operational amplifier 260 is a single stage source degenerated amplifier that includes an input differential pair of transistors 262 (M1, M2) that are coupled to input signals 264 $I_n^+$ and $I_n^-$. The amplifier 260 also includes a floating-gate transistor pair 266 (M3, M4) that are coupled to the source of the differential pair of transistors 262. The floating-gate transistor pair 266 is operable for reducing the offset voltage of the operational amplifier and for reducing the temperature sensitivity of the operational amplifier. In one embodiment, the floating-gate transistor pair 266 may be coupled to a programming circuitry operable for setting the voltage stored by the floating-gate transistors A single stage folded cascode amplifier 300 in accordance with exemplary embodiments of the invention is shown in FIG. 8. The currents through the floating-gate transistor pair 302 (M3, M4) are programmed such that they cancel the offset arising from mismatches in the input differential pair 304 (M1, M2) and the cascoded current mirrors 306 (M5-M8). During normal operation, the multiplexors 308 (S1, S2) are set such that the floating-gate transistors 302 are connected to the cascoded current mirrors 306. During programming, the floating-gate transistors 302 are isolated from the cascoded current mirrors 306 in order to program a difference current $\Delta I(I3-I4)$ such that the offset voltage is nullified.

In the single stage folded cascode amplifier 300, the programming transistors are an integral part of the amplifier thereby simplifying the design process. Initially, all transistors including M3 and M4 are made non floating-gate transistors, by isolating the gate node as described above, and are designed to meet the amplifier's specifications. Next, transistors M3 and M4 are made floating-gate transistors and based on the offset requirement of the amplifier, an estimate can be made of the programming precision required. In other words, an approximate value of the difference current ($\Delta I$) that needs to be programmed can be estimated from which the FOM is calculated. Next, depending on the region of operation of the floating-gate transistors M3 and M4, appropriate equations can be used to estimate the total floating-gate capacitance needed. With the aspect ratio of the transistors set during the amplifier's design stage, the input capacitance and the tunneling capacitance can be sized to either meet or exceed the $C_T$ requirement. Also, the input capacitance $C_{in}$ should be chosen large enough such that the capacitive division from the external gate input Vg to the floating-gate is close to one. Appropriate switches are then added to isolate the floating-gate transistors during programming.

The amplifier 300 exhibits zero offset voltage when all currents are balanced at its output. The input referred offset voltage can be estimated by considering the offsets in the transistor pairs (M1, M2), (M3, M4) and (M9, M10) individually, referring them to the input and applying superposition.

Initially, assume that all transistors except the transistor pair (M9, M10) are matched. Let the threshold voltage mismatch between M9 and M10 be accounted for with the threshold voltage of M10 being different from that of M9 by $\Delta V_{th3}$. This results in a current difference between these devices that leads to an offset voltage in the amplifier. Note that $\Delta V_{th3}$ could be either positive or negative. In order to correct for the offset voltage, one must apply a differential voltage between the gates of M1 and M2 such that the offset voltage is nullified. The input referred offset voltage contribution of (M9, M10) $V_{off3}$ is given by, $$V_{off3} = \frac{U_T}{k} \ln\left[1 - \frac{I_9}{I_1}\left(\exp\left(\frac{k\Delta V_{th3}}{U_T}\right) - 1\right)\right] \quad (19)$$

where, $I_1$ is the bias current through M1 and $I_9$ is the bias current of M9. For typical values of offset mismatch, k and $U_T$, the term inside the exponential is less than 1. Also, by design, it is common to set $I_9$ to be less than $I_1$. Therefore, invoking the Taylor series expansion for both the exponential and the natural logarithm and ignoring higher order terms, (19) simplifies to, $$V_{off3} = -\frac{I_9}{I_1}\Delta V_{th3} \quad (20)$$

Now consider the pFET floating-gate pair assuming that a threshold voltage mismatch and a charge difference exists between their floating-gates. This is accounted for in the gate of M4 by $\Delta V_g$. Again, note that $\Delta V_g$ could be either positive or negative. In this case however, owing to the fact that the drain current of M3 ($I_3$) is greater than $I_1$, the second order terms in the natural logarithm expansion have to be included in the offset estimation, thereby resulting in an input offset voltage contribution of the floating-gate transistors ($\Delta V_{off2}$) given by, $$V_{off2} = \frac{I_3}{I_1}\Delta V_g - \left(\frac{I_3}{I_1}\right)^2 \frac{k}{U_T}\Delta V_g^2 \quad (21)$$

In the case of the input differential pair, their threshold mismatch is accounted for with the threshold voltage of M2 being different from that of M1 by $\Delta V_{th1}$ with $\Delta V_{th1}$ being either positive or negative. This can be nullified by applying a differential voltage between the gates of M1 and M2 that is equal to $\Delta V_{th1}$. Now applying superposition, the effective input referred offset voltage of the amplifier is given by, $$V_{off} = \Delta V_{th1} + \frac{I_3}{I_1}\Delta V_g - \frac{I_9}{I_1}\Delta V_{th3} - \left(\frac{I_3}{I_1}\right)^2 \frac{k}{U_T}\Delta V_g^2 \quad (22)$$

A similar analysis of balancing currents at the output of the amplifier and applying superposition can be applied assuming transistor operation in strong inversion region. Assuming that the threshold mismatches are small in comparison to the overdrive voltages of the transistors, the input referred offset voltage is given by, $$V_{off} = \Delta V_{th1} + \sqrt{\frac{I_3\beta_3}{I_1\beta_1}}\Delta V_g - \sqrt{\frac{I_9\beta_9}{I_1\beta_1}}\Delta V_{th3} \quad (23)$$

where, all variables have the same meaning as before.

Assume initially that the amplifier has an uncompensated input referred offset voltage given by $V_1$off. Let a current difference of $\Delta I_{fg}$ be programmed onto the pFET floating-gate transistors such that this difference current flows through the output to create a voltage equal to $\Delta I_{fg} r_o$ where, $r_o$ represents the effective output impedance at the output of the amplifier. Referring this output offset voltage to the input of the amplifier and taking into account the initial uncompensated input offset results in the overall offset of the amplifier to be, $$V_{of\_f} = V'_{of\_f} + \frac{\Delta I_{fg}}{g_{m1}} \quad (24)$$

where, $g_{m1}$ is the transconductance of the input differential pair. Therefore, based on (24), one would expect the input referred offset voltage of the amplifier to exhibit a linear dependence with the programmed floating-gate difference current. Note that the above expression has been derived without assuming any specific region of device operation. Also, both equations (22) and (23) simplifies to (24) when $\Delta V_g$ is expressed as $\Delta I_{fg}/g_{m3}$.

From (22) and (23), it is clear that the temperature sensitivity of the offset voltage can be estimated based on the sensitivities of the threshold voltage mismatch, ratio of transistor currents and $\beta$'s. Note that $\Delta V_g$ is temperature independent as for a typical operating temperature range, the charge loss on the floating-gate is negligible and therefore assumed constant, and to a first-order, the total floating-gate capacitance is independent of temperature as well.

The temperature dependence of the threshold voltage is given by, $$V_{th}(T) = V_{th}(T_o) + \alpha(T-T_o) \quad (25)$$

where, T is the temperature in Kelvin, $V_{th}(T_o)$ represents the threshold voltage at a temperature $T_o$ and $\chi$ represents the linear temperature co-efficient of the threshold voltage. Now, the temperature dependence of the threshold mismatch between two devices can be written as, $$\Delta V_{th} = \Delta V_{th}(T_o) + \Delta\alpha(T-T_o) \quad (26)$$

where, $\Delta V_g(T_o)$ represents the threshold mismatch at temperature $T_o$ and $\Delta\chi$ is the difference in their temperature coefficients.

Assuming an n-channel transistor with a threshold voltage of 0.7V with a temperature co-efficient of −2 mV/° C., a substrate doping of 1×1017 cm-3, a γ of 0.5 and a gate-bulk voltage ($V_{gb}$) of 1V results in a κ of 0.8049 at room temperature (300K). The variation of κ with temperature over a range of −40° C. to 140° C. was found to be ≈27 ppm/° C. Therefore, it is fair to assume κ to be constant with temperature to simplify the temperature analysis of the amplifier offset voltage.

Next, consider the term $\sqrt{I\beta}$ that appears in the expression for the input offset voltage in the strong inversion region of operation as given in (23). This term can be rewritten as, $$\sqrt{I\beta} = \mu_n C_{ox} \frac{W}{L}(k(V_g - V_{th}) - V_s) = g_m \quad (27)$$

where, all the terms are as defined earlier. Assuming fixed terminal voltages, the only terms that have a temperature dependence in equation (27) are the threshold voltage and mobility. With regards to mobility, for two transistors of the same type, both the value and the temperature dependence can be assumed constant, thereby making the ratio temperature independent. For two transistors that are of dissimilar types, the electron and hole mobilities have slightly different temperature dependence and therefore result in a slight temperature dependent mobility ratio. With the above observations, and (26), the third term in (23) can be written as, $$\sqrt{\frac{I_9\beta_9(T)}{I_1\beta_1(T)}} = \left(\frac{\beta_9(T_o)kV_{od9}(T_o)}{\beta_1(T_o)kV_{od1}(T_o)}\right)\left(\frac{1 - \frac{k\alpha_9\Delta T}{V_{od9}(T_o)}}{1 - \frac{k\alpha_1\Delta T}{V_{od1}(T_o)}}\right) \quad (28)$$

where, $\Delta T = T - T_o$. A similar expression can be arrived at for the third term in (23). Denoting $\kappa\alpha 1/V_{od1}$ as a, $\kappa\alpha_3/V_{od3}$ as b, $\kappa\alpha 9/V_{od9}$ as c and using (26) in (23) results in, $$V_{of\_f}(T) = V_{th1} + \Delta\alpha_1 \Delta T + \frac{gm_3(T_o)}{gm_1(T_o)}\frac{(1-b\Delta T)}{(1-a\Delta T)}\Delta V_g - \quad (29)$$
$$\frac{gm_9(T_o)}{gm_1(T_o)}\frac{(1+c\Delta T)}{(1+a\Delta T)}(\Delta V_{th3} + \Delta\alpha_3 \Delta T))$$

A similar analysis can be performed for weak inversion operation as well. As can be observed from (29), the offset voltage varies with temperature and the variation can be approximated to be quadratic in nature. Also, it is clear that the offset voltage depends on threshold voltage mismatch multiplied by a ratio of quantities (transconductance). Since, the threshold voltage mismatch by itself has a weak temperature dependence, designing the ratio of transconductances to be fairly temperature independent can result in an overall offset voltage that is temperature independent. This can be achieved by either biasing the transistors to their zero-temperature co-efficient transconductances or by designing such that their overdrive voltages are close to each other making the terms a, b and c equal such that the temperature sensitivity is minimized.

Figure 9:
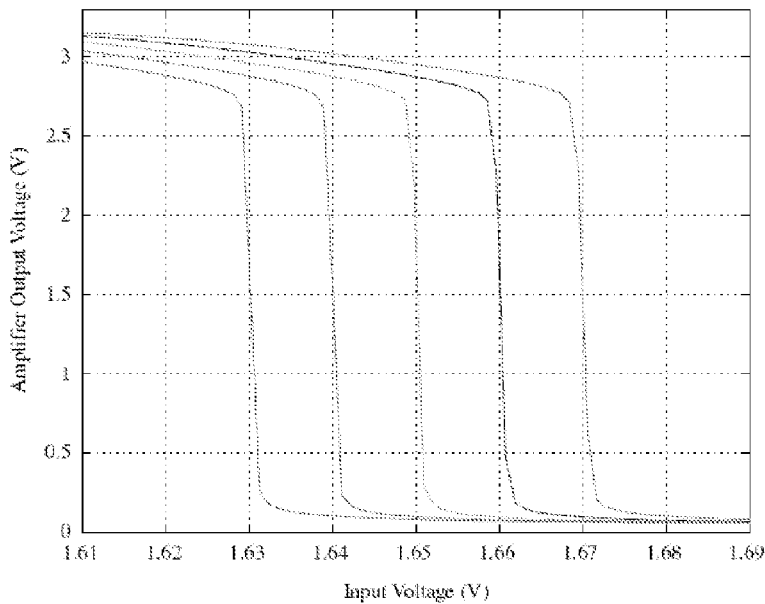
FIG. 9 illustrates a graph that shows the DC transfer characteristics of the amplifier configured as a comparator with the non-inverting terminal held at 1.65V.

An amplifier that uses floating-gate transistors can be designed and fabricated in a 0.5 μm CMOS process. Since, offset cancellation involves one-time programming on account of the long-term charge retention of floating-gate transistors, on-chip complexity can be reduced through the use of an off-chip programming infrastructure. Applying (24) and programming the drain currents of transistors M3 and M4 the amplifier may be programmed to a wide variety of different offset voltages. In one embodiment, the offsets can be programmed in steps of 10 mV ranging from −20 mV-+20 mV. FIG. 9 shows the DC transfer characteristics of the amplifier configured as a comparator with the non-inverting terminal held at 1.65V. As can be observed the comparator trip points are evenly spaced 10 mV apart as programmed, clearly demonstrating the feasibility of the approach.

Figure 10:
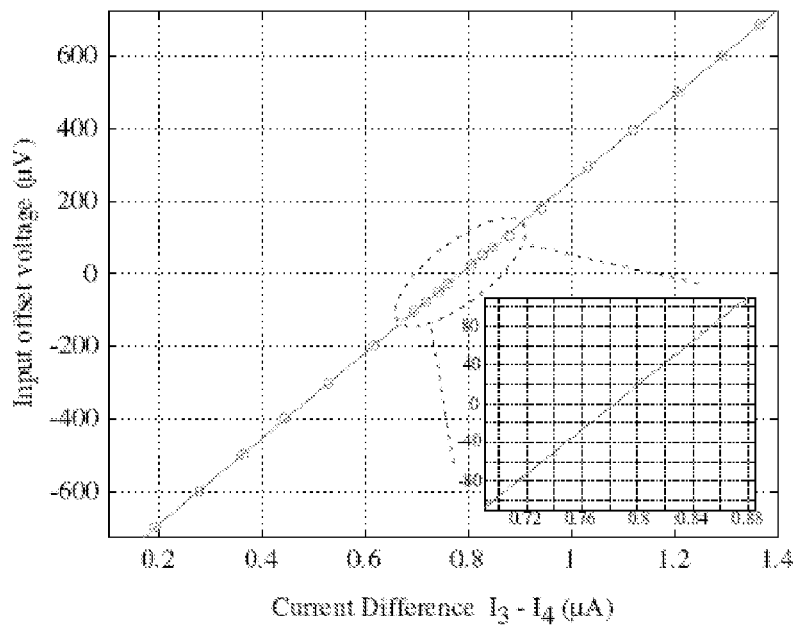
FIG. 10 illustrates a graph that shows the measured input referred offset voltage of the amplifier plotted against the programmed floating-gate difference currents.

Accurate measurements of the offset voltage is made by using the amplifier under test along with a second amplifier configured as a nulling amplifier forming a servo loop. Using such an approach, the offset voltage of the prototype amplifier has been programmed to values as low as ±25 μV. FIG. 10 shows the measured input referred offset voltage of the amplifier plotted against the programmed floating-gate difference currents. The measured data shows a linear dependence of the offset voltage with the programmed difference currents as expected from (24). Experimentally, it is possible to program current increments as low as 0.1 ηA. This indicates that offset voltages in the 100's of nano-volts range are possible to achieve.

Figure 11:
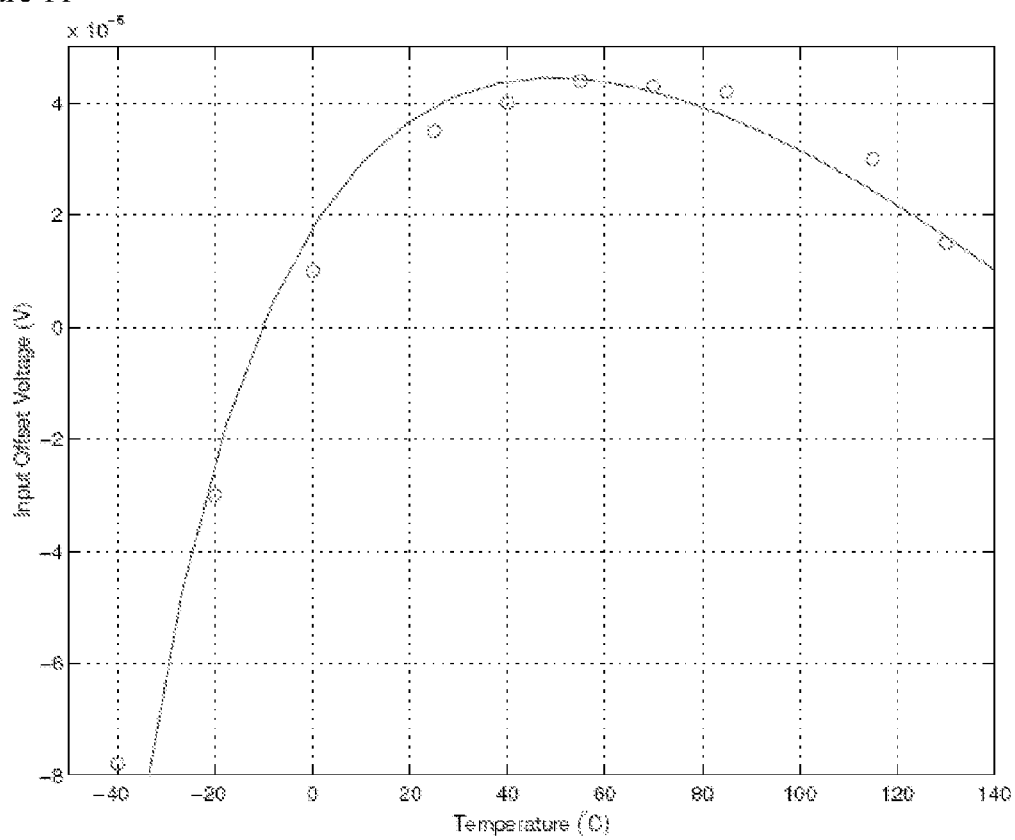
FIG. 11 illustrates a graph that shows the sensitivity of the input offset voltage with temperature.

FIG. 11 shows the sensitivity of the input offset voltage with temperature. The offset voltage was measured for temperatures ranging from −40° C. to 130° C. A maximum change of 130 μV was observed over the full temperature range of 170° C. Since, the transistors in the amplifier were biased in a region close to strong inversion, the temperature dependence was modeled according to (29). Also shown in FIG. 11 is a theoretical fit of the data using (29). Since, the exact values of the threshold voltage mismatch of the various transistor pairs is unknown, the fit was performed using a reasonable set of parameter values. It should be noted that the exact shape of the temperature characteristic depends on the transistor operating regions, biasing conditions and the mismatch between threshold voltages.

Exemplary methods for programming floating-gate transistors are disclosed in U.S. patent application Ser. No. 11/382,640 entitled "Systems and Methods for Programming Floating-Gate Transistors" the entire contents and substance of which is hereby incorporated by reference and in U.S. patent application Ser. No. 11/381,068 entitled "Programmable Voltage-Output Floating-Gate Digital to Analog Converter and Tunable Resistors". Additionally, while the circuits and techniques describe herein can be used for reducing or programming the offsets in the realm of comparators or other applications for correcting systematic offsets in data converters.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A circuit comprising:
   a differential pair of transistors coupled to a pair of input signals; and
   a pair of floating-gate transistors coupled to the differential pair of transistors, wherein the pair of floating-gate transistors are operable for reducing an offset voltage of the circuit and wherein the pair of floating-gate transistors are located outside the signal path of the differential pair of transistors;
   wherein the circuit further comprises a programming circuitry selectively connected to the pair of floating-gate transistors; and
   wherein a multiplexor selectively connects the programming circuitry to the pair of floating-gate transistors.

2. An operational amplifier comprising:
   a differential pair of transistors, including a first and a second transistor, said first and second transistor comprising a gate, a drain, and a source;
   a pair of floating-gate transistors, including a third and fourth transistor, said third and fourth transistor comprising a gate, a drain, and a source;
   wherein the drain of the third transistor is coupled to the drain of the fourth,
   wherein the source of the third transistor is coupled to the drain of the first transistor and the source of the fourth transistor is coupled to the drain of the second transistor, and
   wherein the pair of floating-gate transistors are operable for reducing an offset voltage of the operational amplifier and wherein the pair of floating-gate transistors are located outside the signal path of the differential pair of transistors.

3. The operational amplifier of claim 2, wherein the operational amplifier further comprises a programming circuitry selectively connected to the pair of floating-gate transistors.

4. The operational amplifier of claim 3, wherein the programming circuitry includes a current mirror.

5. The operation amplifier of claim 3, wherein the floating-gate transistors are programmed by the using Fowler-Nordheim tunneling and a hot-electron injection mechanism.

6. An operational amplifier comprising:
   a differential pair of transistors, including a first and a second transistor, said first and second transistor comprising a gate, a drain, and a source;
   a pair of floating-gate transistors, including a third and fourth transistor, said third and fourth transistor comprising a gate, a drain, and a source;
   wherein the drain of the first transistor is coupled to the drain of the second transistor,
   wherein the source of the first transistor is coupled to the drain of the third transistor and the source of the second transistor is coupled to the drain of the fourth transistor, and
   wherein the pair of floating-gate transistors are operable for reducing an offset voltage of the operational amplifier and wherein the pair of floating-gate transistors are located outside the signal path of the differential pair of transistors.

7. The operational amplifier of claim 6, wherein the operational amplifier further comprises a programming circuitry selectively connected to the pair of floating-gate transistors.

8. The operational amplifier of claim 7, wherein the programming circuitry includes a current mirror.

9. The operation amplifier of claim 6, wherein the floating-gate transistors are programmed by the using Fowler-Nordheim tunneling and a hot-electron injection mechanism.

* * * * *